United States Patent
Kim et al.

(10) Patent No.: US 7,738,278 B2
(45) Date of Patent: *Jun. 15, 2010

(54) MAGNETIC MEMORY DEVICE USING MAGNETIC DOMAIN MOTION

(75) Inventors: Tae-wan Kim, Yongin-si (KR); Young-jin Cho, Suwon-si (KR); Kee-won Kim, Yongin-si (KR); In-jun Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 154 days.

This patent is subject to a terminal disclaimer.

(21) Appl. No.: 11/706,988

(22) Filed: Feb. 16, 2007

(65) Prior Publication Data
US 2007/0195587 A1 Aug. 23, 2007

(30) Foreign Application Priority Data
Feb. 22, 2006 (KR) ................ 10-2006-0017238

(51) Int. Cl.
*G11C 19/00* (2006.01)
(52) U.S. Cl. .............. 365/80; 365/158; 365/1; 365/29; 365/34; 365/85; 365/81
(58) Field of Classification Search ........... 365/158, 365/80, 1, 29, 34, 85, 81
See application file for complete search history.

(56) References Cited

U.S. PATENT DOCUMENTS

| | | | |
|---|---|---|---|
| 3,940,750 A | 2/1976 | Voegeli | |
| 6,834,005 B1 * | 12/2004 | Parkin | 365/80 |
| 7,190,613 B2 | 3/2007 | Nagase et al. | |
| 7,236,386 B2 * | 6/2007 | Parkin | 365/80 |
| 7,242,604 B2 * | 7/2007 | Klaeui et al. | 365/145 |
| 7,304,359 B2 * | 12/2007 | Kim et al. | 257/421 |
| 7,382,643 B2 | 6/2008 | Ashida et al. | |
| 7,477,539 B2 | 1/2009 | Kim et al. | |
| 2003/0117837 A1 * | 6/2003 | Park et al. | 365/158 |
| 2004/0251232 A1 | 12/2004 | Chen et al. | |
| 2004/0257719 A1 | 12/2004 | Ohba et al. | |
| 2005/0078511 A1 | 4/2005 | Parkin | |

FOREIGN PATENT DOCUMENTS

| | | |
|---|---|---|
| EP | 1 320 102 | 6/2003 |
| EP | 1 701 357 | 9/2006 |

(Continued)

OTHER PUBLICATIONS

U.S. Appl. No. 11/707,002.*

(Continued)

*Primary Examiner*—Hoai V Ho
*Assistant Examiner*—Kretelia Graham
(74) *Attorney, Agent, or Firm*—Harness, Dickey & Pierce, P.L.C.

(57) ABSTRACT

A magnetic memory device is provided. The magnetic memory device may include a memory track in which a plurality of magnetic domains is formed so that data bits, each of which may be a magnetic domain, are stored in an array. The memory track may be formed of an amorphous soft magnetic material.

16 Claims, 7 Drawing Sheets

FOREIGN PATENT DOCUMENTS

| EP | 1 708 257 | 10/2006 |
|---|---|---|
| KR | 10-2003-0048842 | 6/2003 |

OTHER PUBLICATIONS

U.S. Appl. No. 11/657,646.*

L. Gan et al., "Pulsed-Current-Induced Domain Wall Propagation in Permalloy Patterns Observed Using Magnetic Force Microscope", *IEEE Transactions on Magnetics*, vol. 36, No. 5, Sep. 2000.

Chun Byong et al., "Magnetization Switching and Tunneling Magnetoresistance Effects of Synthetic Antiferromagnet Free Layers Consisting of Amorphous NiFeSiB." Applied Physics Letters, AIP, American Institute of Physics, Melville, NY, vol. 87, No. 8, Aug. 18, 2005.

Office Action for corresponding European Application No. 06123193.2 dated Mar. 20, 2007.

European Search Report and Written Opinion dated Jul. 4, 2007 for European Application No. 07102164.6.

European Search Report dated Mar. 22, 2007 for European Application No. 07100691.0.

Korean Office Action dated Dec. 13, 2006.

* cited by examiner

MAGNETIC MEMORY DEVICE USING MAGNETIC DOMAIN MOTION

PRIORITY STATEMENT

This application claims the benefit of priority to Korean Patent Application No. 10-2006-0017238, filed on Feb. 22, 2006, in the Korean Intellectual Property Office, the entire contents of which are incorporated herein by reference.

BACKGROUND

1. Field of the Invention

Example embodiments relate to a magnetic memory device, and more particularly, to a magnetic memory device where data bits are stored in an array. Each data bit may include a magnetic domain and may be moved according to magnetic domain motion. Example embodiments also relate to methods of reading and writing to the magnetic memory device.

2. Description of the Related Art

A magnetic random access memory (MRAM) is an example of a non-volatile magnetic memory and may operate based on a magnetic resistance effect, which takes advantage of spin-dependent conduction peculiar to a nano-magnetic material. An MRAM may operate based on the giant magnetoresistance (GMR) effect or the tunnel magnetoresistance (TMR) effect manifesting as spin. Spin is a degree of freedom of an electron and may have an influence on electron delivery.

The GMR effect manifests as a resistance difference observed in an arrangement of ferromagnetic materials having a non-magnetic material interposed therebetween. The resistance difference results from an orientation of magnetization directions in a ferromagnetic material/metallic non-magnetic material/ferromagnetic material arrangement. The TMR effect occurs in an arrangement of ferromagnetic materials having an insulator interposed therebetween. The TMR resistance of the arrangement may allow current to more easily flow through the arrangement if two ferromagnetic materials have the same magnetization direction as compared to a case in which the two ferromagnetic materials have different magnetization directions.

Because a conventional MRAM based on the GMR effect generally has a relatively small resistance difference caused by a magnetization direction, a large voltage difference generally cannot be achieved. Also, because a conventional MRAM has the disadvantage that a size of a metal oxide semiconductor field effect transistor (MOSFET) that may be combined with a GMR layer in order to form a cell should increase, research pursuing commercialization of an MRAM using the TMR layer instead of a GMR layer is more actively being pursued.

A conventional MRAM may include a transistor, which is a switching device, and a magnetic tunnel junction (MTJ) cell in which data may be stored. Generally, the MTJ cell may include a pinned ferromagnetic layer having a pinned magnetization direction, a free ferromagnetic layer whose magnetization direction may be parallel or anti-parallel to the pinned magnetization direction of the pinned ferromagnetic layer, and a non-magnetic layer located between and magnetically separating the pinned ferromagnetic layer and the free ferromagnetic layer.

However, because a conventional MRAM having MTJ cells only stores one-bit data per cell, the conventional MRAM is limited with respect to increasing data storage.

SUMMARY

An example embodiment provides a magnetic memory device. The magnetic memory device may include a plurality of magnetic domains and may store a plurality of data bits in an array. Each magnetic domain may correspond to a data bit. The memory track may be formed of an amorphous soft magnetic material.

According to an example embodiment, the memory track may be formed of NiFe group IV element alloy, e.g., NiFeSiB.

According to an example embodiment, the memory track may be formed of an amorphous soft magnetic material having a larger magnetic anisotropy constant than that of the NiFe.

According to an example embodiment, the memory device may also include a reference layer corresponding to a portion of the memory track and having a pinned magnetization direction; and a first input portion electrically connected to the memory track and inputting a magnetic domain motion signal to move data stored on a data bit region of the memory track to an adjacent and/or adjoining data bit region. The magnetization direction of the memory track may be switchable.

According to an example embodiment, a non-magnetic layer may be interposed between the reference layer and the memory track.

According to an example embodiment, the non-magnetic layer may be one of a conduction layer and an insulation layer serving as a tunneling barrier.

According to an example embodiment, the memory track may include at least one data storage region having data bit regions corresponding to the number of data bits to be stored and storing a plurality of data bits; and at least one buffer region adjacent and/or adjoining a data storage region of the at least one data storage region and storing data moved to the outside of the data storage region during a magnetic domain motion.

According to an example embodiment, the memory device may also include a second input portion electrically connected to at least one of the data bit regions of the memory track and the reference layer, and inputting at least one of a writing current signal and a reading current signal.

According to an example embodiment, the memory track may include a plurality of data storage regions, a buffer region is located between two adjacent data storage regions, and at least one second input portion. At least one second input portion may be formed for each data storage region.

An example embodiment provides a method of reading data from a memory device. The method may include applying a reading pulse signal to a data bit region; obtaining a resistance value of the data bit region, the resistance value of the data bit region varying based on magnetization; and determining data stored in the data bit region based on the obtained resistance value.

An example embodiment provides a method for writing data to a memory device. The method may include switching a magnetization direction of a data bit region to affect a magnetic domain of the data bit region; and moving the affected magnetic domain to an adjacent data bit region of the memory device.

BRIEF DESCRIPTION OF THE DRAWINGS

The above and other features and advantages of example embodiments will become more apparent from a review of the following detailed description of the example embodiments and the attached drawings in which.

DETAILED DESCRIPTION OF EXAMPLE EMBODIMENTS

Figure 1:
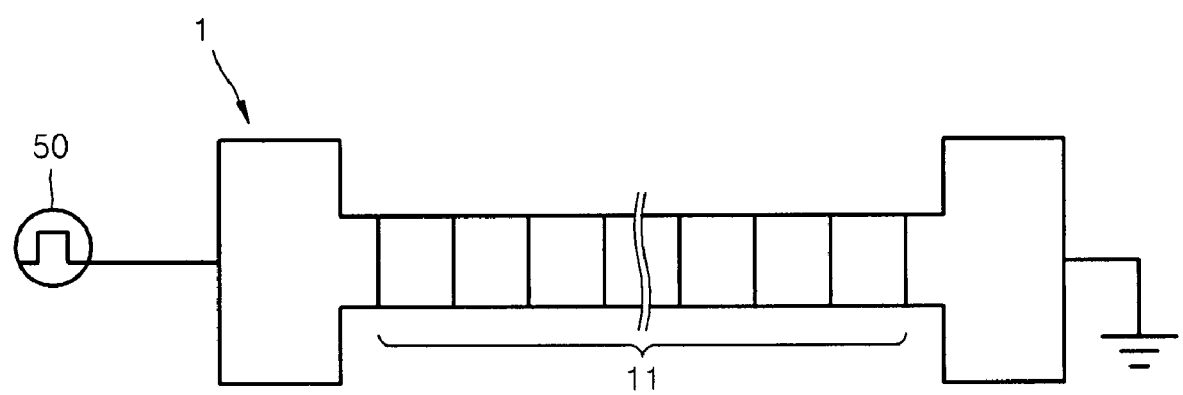
FIG. 1 is a schematic view of an example embodiment of a magnetic memory device.

Various example embodiments will now be described more fully with reference to the accompanying drawings in which some example embodiments are shown. Detailed example embodiments are disclosed herein. However, specific structural and functional details disclosed herein are merely representative for purposes of describing example embodiments, and one skilled in the art will appreciate that example embodiments may be embodied in many alternate forms and should not be construed as limited to only the embodiments set forth herein.

Accordingly, while example embodiments are capable of various modifications and alternative forms, example embodiments are shown by way of example in the drawings and are described in detail below. It should be understood, however, that there is no intent to limit example embodiments to the particular forms disclosed, but on the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Hereinafter, example embodiments of a magnetic memory device and operation thereof are described with reference to the accompanying drawings.

FIG. 1 is a schematic view of an example embodiment of a magnetic memory device.

Referring to FIG. 1, the magnetic memory device 1 may include a memory track 11 where a plurality of magnetic domains may be formed. A data bit, which may be in the form of a magnetic domain, may be stored in an array in the memory track 11. The magnetic memory device 1 may also include a first input portion 50 electrically connected to the memory track 11. The first input portion 50 may be used to input a magnetic domain motion signal, for example.

According to an example embodiment, magnetic domain walls may be formed in the memory track 11. A plurality of magnetic domains may be formed in the memory track 11 based on the magnetic domain walls.

Magnetization directions of the memory track 11 may be switchable so that data may be recorded on the memory track 11. The magnetic memory device 1 may record a data bit according to a magnetization direction of a magnetic domain. For example, the magnetic memory device 1, as described in an example embodiment below, may be formed to record a data bit, e.g., a "0" or a "1", by reversing a magnetization direction of a magnetic domain of the memory track 11 using spin transfer torque. This may be referred to as current induced magnetic switching (CIMS). In another example, a magnetic memory device 1 according to an example embodiment may be formed to record a data bit by reversing a magnetization direction of a magnetic domain using a magnetic field induced to a magnetic track by an applied current.

According to an example embodiment, the memory track 11 may be formed of an amorphous soft magnetic material having a large magnetic anisotropy constant Ku so that a magnetic domain motion may be easily performed.

Because NiFe, which is a general soft magnetic material, has a relatively small magnetic anisotropy constant, a relatively high current is used to provide a magnetic domain motion if a memory track providing a plurality of magnetic domains using NiFe is formed. Therefore, according to an example embodiment, the memory track 11 may be formed of an amorphous soft magnetic material having a larger magnetic anisotropy constant Ku than that of NiFe. For example, the memory track 11 may be formed of NiFe group IV element alloy having a large magnetic anisotropy constant, such as NiFeSiB, for example.

Because an amorphous soft magnetic material of NiFe group IV element alloy such as NiFeSiB has a relatively high anisotropy magnetic field Hk, magnetic anisotropy may be easily formed.

If a current required for a magnetic domain motion is relatively high, a possibility that a magnetic material is cut off in an intermediate portion by an applied current for a magnetic domain motion is relatively high. Therefore, to form a domain motion memory track 11 according to an example embodiment, a material where a magnetic domain motion is relatively easily performed even with application of a low current is generally used.

If a domain wall width is reduced, a magnetic domain motion may be realized even with small energy (e.g., current). The domain wall width W is generally in proportion with surface energy Γ of a domain wall as shown in Equation 1.

$$\Gamma \propto W \qquad \text{Equation 1}$$

Also, a width of a domain wall is generally in proportion with a square root of a magnetic anisotropy constant Ku as shown in Equation 2.

$$W \propto (K_u)^{\frac{1}{2}} \qquad \text{Equation 2}$$

As is illustrated in Equations 1 and 2, a material having a relatively large magnetic anisotropy constant should be used for forming the memory track 11 in order to reduce the width of a domain wall, thereby reducing the energy, e.g., current, used for a magnetic domain motion according to an example embodiment.

If the memory track 11 is formed of an amorphous soft magnetic material having a large magnetic anisotropy, a magnetic domain motion may be easily performed even with a relatively small current, and cutting off of the magnetic material may be reduced and/or prevented. Accordingly, in an example embodiment, the memory track 11 may be formed of an amorphous soft magnetic material.

Figure 2:
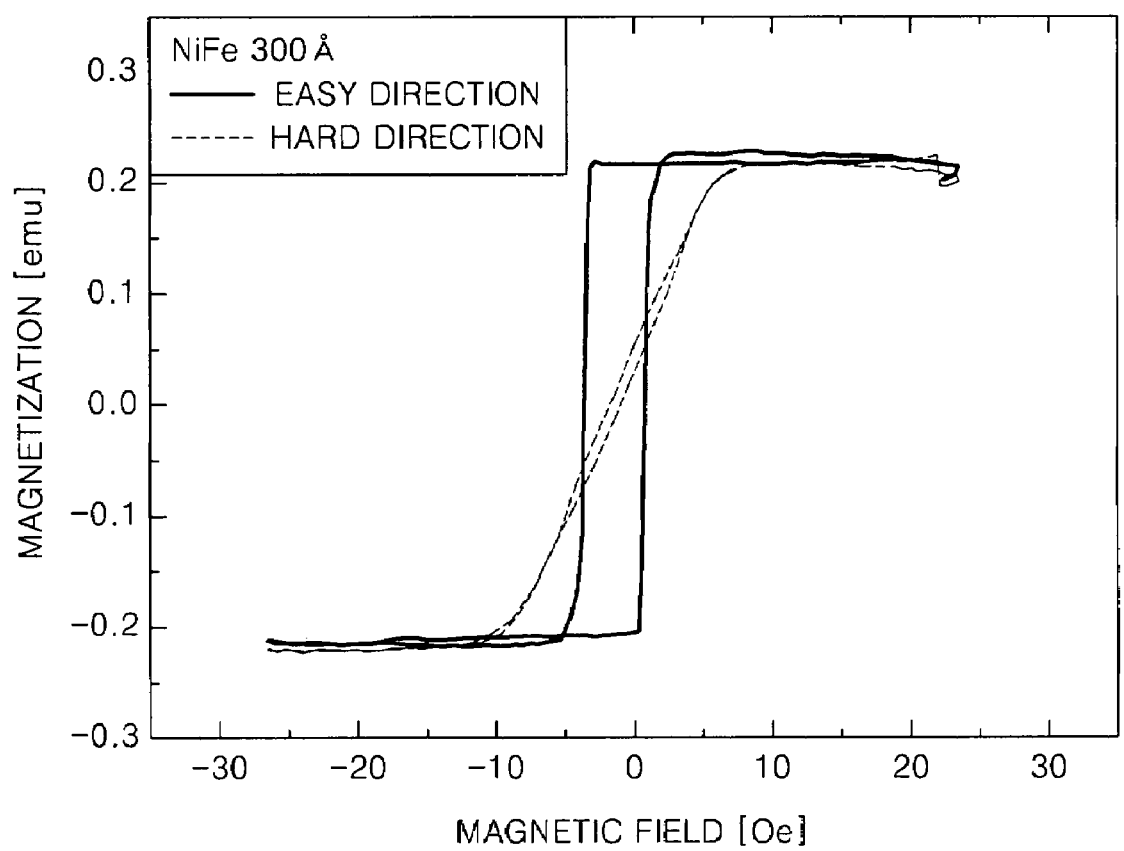
FIG. 2 is a view illustrating a magnetic hysteresis curve of NiFe which is a soft magnetic material.
Figure 3:
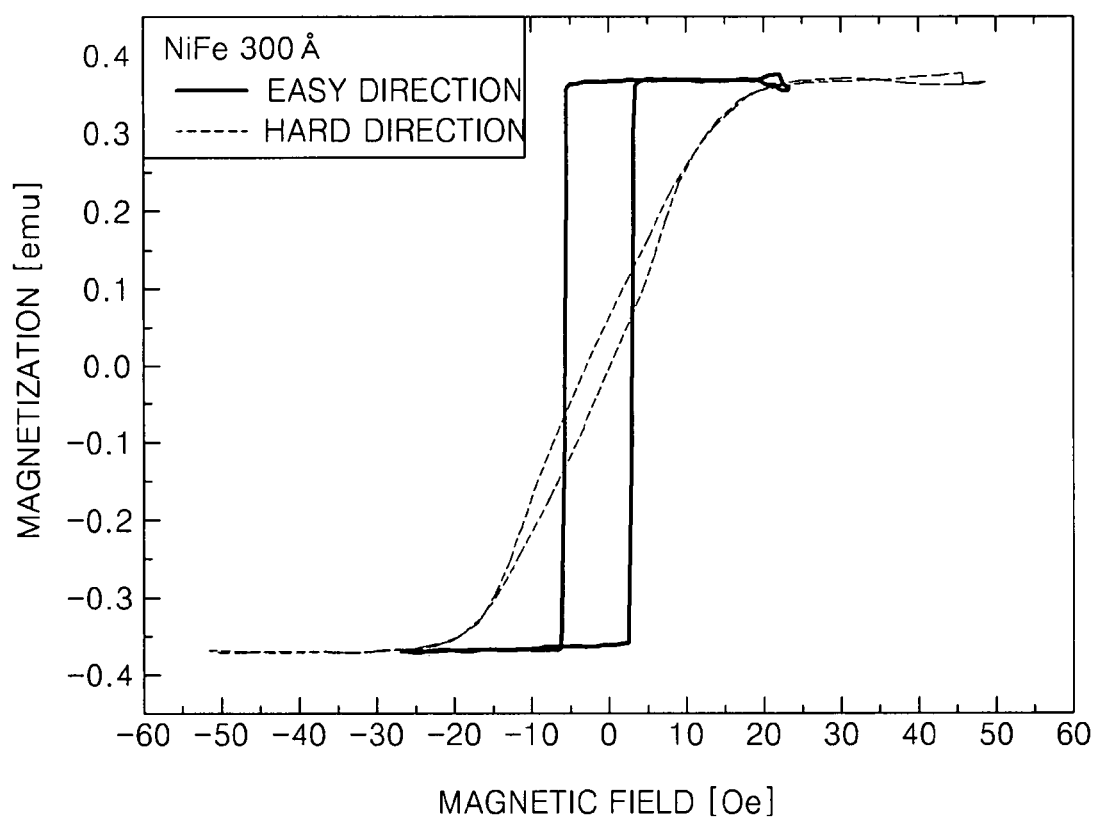
FIG. 3 is a view illustrating a magnetic hysteresis curve of NiFeSiB which is an amorphous soft magnetic material.

FIG. 2 is a view illustrating a magnetic hysteresis curve of NiFe which is a soft magnetic material, and FIG. 3 is a view illustrating a magnetic hysteresis curve of NiFeSiB which is an amorphous soft magnetic material. In detail, FIG. 2 shows a hysteresis curve of $Ni_{81}Fe_{19}$, and FIG. 3 shows a hysteresis curve of $Ni_{16}Fe_{62}Si_8B_{14}$. Each of FIGS. 2 and 3 show a hysteresis curve when a magnetic field is applied in an easy direction and a hysteresis curve when a magnetic field is applied in a hard direction. The magnetic directions referred to as the easy direction and the hard direction may be anti-parallel to each other.

An examination of FIGS. 2 and 3 shows that coercivity Hc of NiFe is about 10 Oe and coercivity Hc of NiFeSiB is about 20 Oe. Accordingly, the coercivity Hc of NiFeSiB, which is an amorphous soft magnetic material, is about two times greater than the coercivity Hc of NiFe. Therefore, induced magnetic anisotropy of NiFeSiB is two or more times greater than that of general NiFe.

A magnetic domain anisotropy magnetic field Hk may be in proportion to coercivity Hc and a magnetic anisotropy constant Ku. Therefore, the magnetic anisotropy constant may be in proportion to coercivity Hc.

Therefore, if an amorphous soft-magnetic material such as NiFeSiB, for example, having high coercivity and high magnetic anisotropy is used in an example embodiment, stable bit formation may be achieved and a strip magnetic domain may be formed. Accordingly, a data bit, which may be in the form of a magnetic domain, may be stored in an array and a width of a domain wall may be reduced. As such, a magnetic domain motion may be realized even with a relatively low current and thus, a magnetic domain motion may be relatively easily performed. Because a magnetic domain motion may be performed with a relatively low current in the memory track 11 formed of an amorphous soft magnetic material, cutting off of the magnetic material may be reduced and/or prevented in an example embodiment.

Therefore, if the memory track 11 is formed of an amorphous soft magnetic material of NiFe group IV element alloy such as NiFeSiB, for example, a magnetic memory 1 where a data bit may be stored in an array and a magnetic domain motion may be easily performed.

According to an example embodiment, a first input portion 50 may be electrically connected to the memory track 11 to move a magnetic domain of the memory track 11 and thus, move data stored in a data bit region to an adjacent data bit region. The data may be moved based on in plane magnetization or perpendicular magnetization, for example. A magnetization direction of a magnetic domain may be moved to an adjoining magnetic domain according to a motion signal input, e.g., a motion current signal input through the first input portion 50. Movement of a magnetic domain is referred to as a magnetic domain motion.

Figure 7:
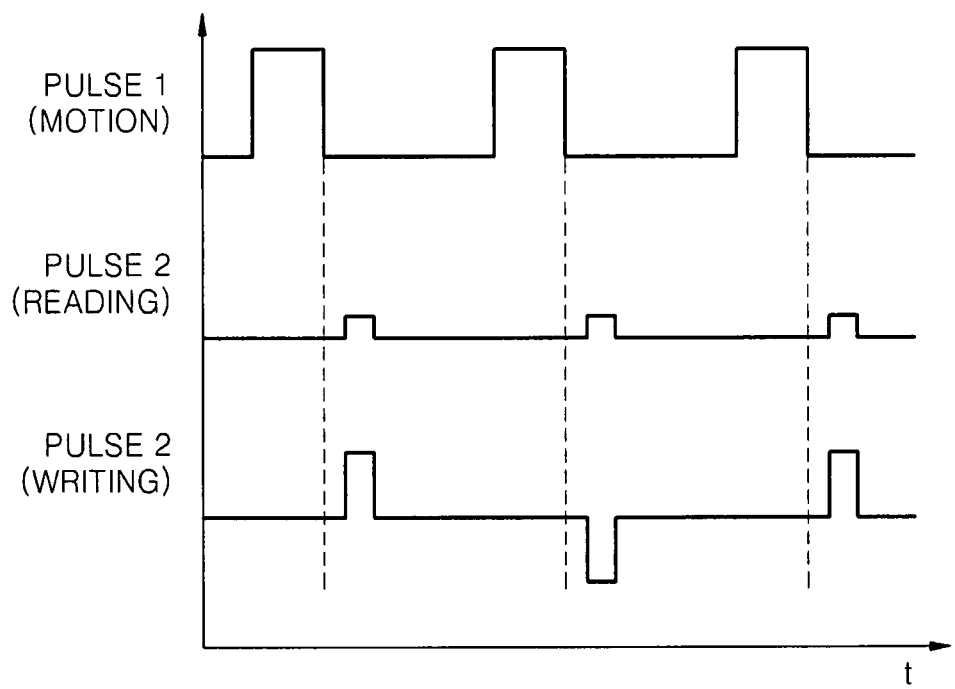
FIG. 7 is a schematic graph illustrating an example magnetic domain motion current Pulse 1, an example reading current Pulse 2 and an example writing current Pulse 2 that may be applied to a magnetic memory device according to an example embodiment.

The motion signal may be a pulse current input with a constant period. The pulse current input Pulse 1 shown in FIG. 7 is one example of a motion signal. The motion signal may be input such that a magnetic domain motion is performed on a data bit region unit, which may include a single magnetic domain. Because the magnetic domain motion is to substantially move a magnetization direction of a desired and/or predetermined magnetic domain to an adjoining magnetic domain, the motion signal may be continuously applied while the magnetic domain motion is performed by a data bit region unit and/or may be periodically applied such that the magnetic domain motion is performed by a data bit region unit.

According to the above-described example embodiment of the magnetic memory 1, a plurality of data bits may be stored per memory track 11 and thus, information storage capacity of the magnetic memory 1 may be remarkably increased as compared with conventional memory devices. As described above, the magnetic memory 1 may include a memory track 11 where a plurality of magnetic domains may be formed and data bits, which may each correspond to a single magnetic domain, may be stored in an array. Also, because the magnetic domain of the memory track 11 may be easily moved using a relatively low current, it is possible to read and/or write a plurality of data bits on the memory track 11 by performing a data reading and/or data writing operation and a magnetic domain motion as described further detailed below.

Figure 4:
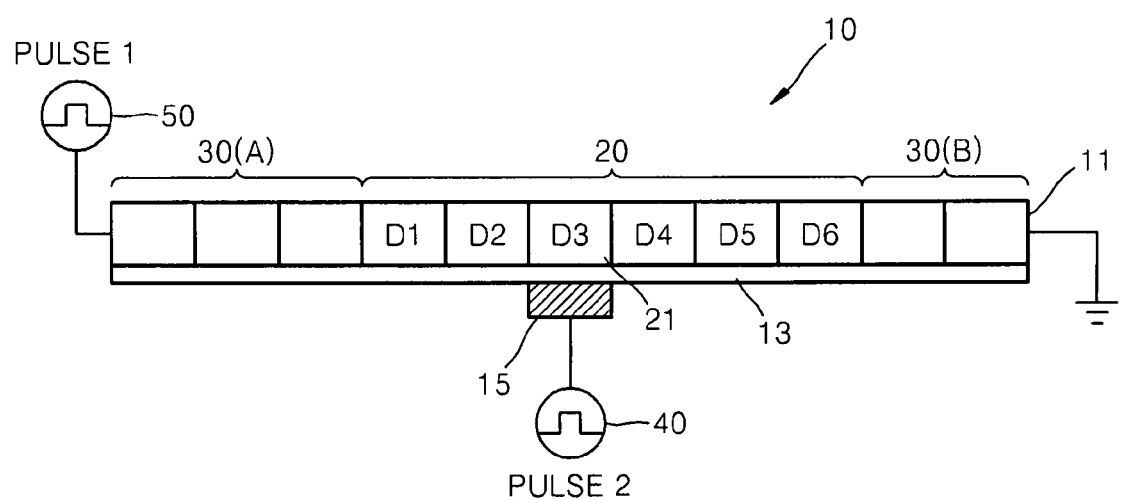
FIG. 4 is a schematic view illustrating an example embodiment of a magnetic memory device.

FIG. 4 is a schematic view illustrating a magnetic memory device according to an example embodiment, where the magnetic memory device may record a data bit, e.g., "0" or "1", by reversing a magnetization direction of a magnetic domain of the memory track 11 using spin transfer torque. Because the memory track 11 and the first input portion 50 shown in FIG. 4 are the substantially the same as the memory track 11 and the first input portion 50 shown in FIG. 1, the same reference numerals are used and a detailed description thereof is omitted for the sake of brevity.

Referring to FIG. 4, the magnetic memory device 10 may include a memory track 11; a first input portion 50 inputting a magnetic domain motion signal for the memory track 11; and a reference layer 15 formed corresponding to a portion of the memory track 11 and having a pinned magnetization direction. A data bit, which may be a magnetic domain corresponding to an effective size of the reference layer 15, may be stored in an array on the memory track 11. The magnetic memory device 10 may also include a second input portion 40 electrically connected to at least one data bit region of the memory track 11 and a reference layer 15 and inputting at least one of a writing current signal and a reading current signal. A non-magnetic layer 13 may be located between the reference layer 15 and the memory track 11. Although the non-magnetic layer 13 is formed over an entire surface of the memory track 11 in the example embodiment of the magnetic memory device 10 of FIG. 4, the non-magnetic layer 13 may be only be formed on an upper surface of the reference layer 15 according to another example embodiment.

As described above, the memory track 11 may include a strip of the plurality of magnetic domains so that a data bit, which may be a single magnetic domain, may be stored in an array. Also, the memory track 11 may be formed of an amorphous soft magnetic material such as NiFeSiB, for example, so that a magnetic domain motion may be performed even with a low current according to an example embodiment.

The memory track 11 may be a recording layer whose magnetization direction may be switched and on which a data bit may be stored according to an example embodiment.

The reference layer 15 may be a pinned layer whose magnetization direction is pinned. The reference layer 15 may be formed to have an effective size corresponding to one data bit region (e.g., one magnetic domain) of the memory track 11 according to an example embodiment.

The non-magnetic layer 13 located between the memory track 11 and the reference layer 15 may be one of a conduction layer such as Cu, for example, and an insulation layer such as an aluminum oxide layer, for example, serving as a tunneling barrier.

In the magnetic memory 10 according to an example embodiment, a data writing operation and/or a stored data reading operation may be performed by an area unit of the memory track 11 corresponding to an effective size of the reference layer 15. Therefore, the effective size of the reference layer 15 may substantially determine a size of one data bit region (e.g., a magnetic domain) of the memory track 11.

Because it is preferable, although not required according to an example embodiment, that only a single magnetic domain is present within one data bit region, a magnetic domain formed in the memory track 11 may be formed in at least a size corresponding to the effective size of the reference layer 15.

Also, the memory track 11 may be formed having a length as long as a multiple of the number of data bit regions that corresponds to the effective size of the reference layer 15, that is, a width of a magnetic domain motion. Accordingly, an array of a plurality of data bit regions in which each region may be a single magnetic domain, is provided by a unit of an effective size of the reference layer 15 so that the memory track 11 where a plurality of data bits may be stored in an array is obtained.

Referring to FIG. 4, the memory track 11 may include a data storage region 20 having data bit regions D1, D2, D3, D4, D5, and D6, which may correspond to the number of data bits to be stored, and storing a plurality of data bits; and a buffer region 30 adjoining the data storage region 20 and storing, if desired and/or necessary, data moved to outside of the data storage region 20 during a magnetic domain motion. The buffer region 30 is located on at least one side of the data storage region 20 according to an example embodiment.

If the data storage region 20 has n data bit regions, the buffer region 30 may have at least n−1 data bit regions. That is, the number of the data bit regions contained in the buffer region 30 may be substantially the same as the number of data bit regions in the data storage region 20. The number of the data bit regions in the buffer region 30 may be the same number or about 1 less than the number of the data bit regions of the data storage region 20. FIG. 4 shows an example where a central portion of the memory track 11 is used as the data storage region 20 and both edge portions of the memory track 11 are used as the buffer regions 30A and B. According to an example embodiment, a writing and/or reading operation is not directly performed on the buffer region 30. Because a writing and/or reading operation is not directly performed on the buffer region 30, the buffer region 30 may include only the memory track 11, which is a recording layer. Alternatively, the buffer region 30 may include a layer structure having the memory track 11 and the non-magnetic layer 13. As such, in a magnetic memory device 10, according to an example embodiment, the buffer region 30 may have substantially the same layer structure as that of the data storage region 20, that is, a layer structure that includes even the reference layer 15 with a signal not input to the reference layer 15 of the buffer region 30.

In FIG. 4, a data writing and/or reading operation may be performed on a third data bit region D3, and a first portion A and a second portion B of the buffer region 30 may be provided on both edges of the data storage region 20. FIG. 4 shows the first portion A of the buffer region 30 having three data bit regions on the left side of the data storage region 20 and the second portion B of the buffer region 30 having two data bit regions on the right side of the data storage region 20. The configuration shown in FIG. 4 may be used if a magnetic domain motion is performed from left to right during a data reading operation. For data contained in six data bit regions D1, D2, D3, D4, D5, and D6 of the data storage region 20, a data reading operation may start with the sixth data bit region D6 being moved to the left such that data of the sixth data bit region D6 is positioned at a location corresponding to the location of the third data bit region D3 in FIG. 4. A motion operation and/or a reading operation may then be sequentially performed while the data is moved to the right so that the data contained in the six data bit regions D1, D2, D3, D4, D5, and D6 may be sequentially read.

Though FIG. 4 shows an example embodiment where the reference layer 15 is formed on a middle portion of the data storage region 20 and thus, a data writing and/or reading operation is performed on the middle portion of the data storage region 20, example embodiments are not limited to this particular example and various modifications may be made. For example, a data writing and/or reading operation may be performed on a first data bit region D1 of the data storage region 20, and the buffer region 30 may only be formed adjacent to a data bit region of the data storage region 20 where the data writing and/or reading operation starts.

If the buffer region 30 is formed only on the right or left of a data storage region 20, data contained in the data storage region 20 may be moved to the buffer region 30, and then the data reading operation may be performed. In this case, a magnetic domain motion performed during the data reading operation and a magnetic domain motion performed during the data writing operation may be performed in the same direction. Also, the data reading operation may be substantially simultaneously performed while data contained in the data storage region 20 is moved to the buffer region 30 according to an example embodiment. In this case, a magnetic domain motion performed during the data reading operation and a magnetic domain motion performed during the data writing operation may be performed in mutually opposite directions.

According to an example embodiment, if n data bits are stored in the data storage region 20, the number of data bit regions of the buffer region 30 may be one-bit region smaller than that of the data storage region 20. That is, the buffer region 30 may be formed to store (n−1) data bits. Because one data bit may be stored on a data bit region, e.g., a specific data bit region 21 of the data storage region 20 where the data writing and/or reading operation is performed, the buffer region 30 may only need to temporarily store (n−1) data bits. However, the buffer region 30 may have the same number, or a larger number, of data bit regions as the data storage region 20 according to an example embodiment.

If the buffer regions 30 are formed on both sides of the data storage region 20, data contained in the data storage region 20 may be read while a magnetic domain motion is performed without moving the data to the buffer region 30. In this example embodiment, a magnetic domain motion performed during the data reading operation and a magnetic domain motion performed during the data writing operation may be performed in mutually opposite directions. Even in this case, if n data bits are stored on the data storage region 20, the number of data bit regions of the buffer regions 30 formed on both sides of the data storage region 20 may be one bit region less than the number of data bit regions in the data storage region 20.

In another example embodiment, although the memory track 11 of the magnetic memory device 10 has the buffer region 30 adjoining the data storage region 20, the memory track 11 may include the data storage region 20 without the buffer region 30. In this example embodiment, the data storage region 20 may include redundant data bit regions serving as a buffer instead of the buffer region 30. For example, if n data bits are to be stored, the data storage region 20 may include at least 2n or 2n−1 data bit regions.

In the magnetic memory device 10 in accordance with an example embodiment, an adjoining magnetic domain of the memory track 11 may be moved and a data bit, e.g., "0" or "1", may be recorded on a desired and/or predetermined magnetic domain by reversing a magnetization direction of one of the magnetic domains, e.g., the desired and/or predetermined magnetic domain, located at a desired and/or predetermined position corresponding to the reference layer 15 using spin transfer torque, e.g., current induced magnetic switching (CIMS). This may be a result of a magnetic domain motion signal Pulse 1 applied from the first input portion 50 and a writing current signal (e.g., Pulse 2 (writing) in FIG. 7) applied in synchronization with this magnetic domain motion signal Pulse 1 from the second input portion 40.

Additionally, in an example embodiment of a magnetic memory device 10, a magnetic domain may be moved, and data stored on a magnetic domain of a memory track 11 may be read by applying a reading signal, e.g., a reading pulse signal using spin tunneling, for example, between the memory track 11, which may be a recording layer, and the reference layer 15. This may be a result of a magnetic domain motion signal (Pulse 1) applied from the first input portion 50 and a reading signal (e.g., Pulse 2 (reading) in FIG. 7) applied in synchronization with this motion signal (Pulse 1) from the second input portion 40.

In FIG. 4, Pulse 1 is an example of magnetic domain motion signal and Pulse 2 (writing) and Pulse 2 (reading) are examples of a writing signal and reading signal, respectively.

According to an example embodiment, the second input portion 40 may be electrically connected to the memory track 11 and the reference layer 15. FIG. 4 shows that the second input portion 40 is electrically connected to the reference layer 15 and a desired and/or predetermined data bit region 21 of the memory track 11 that is located on the reference layer 15.

A writing signal may be input to the desired and/or predetermined data bit region 21 of the memory track 11 and the reference layer 15 through the second input portion 40, and a magnetization direction of the desired and/or predetermined data bit region 21 of the memory track 11 that is located on the reference layer 15 may be determined based on this writing signal. In FIG. 4, the data storage region 20 has an array of first to sixth data bit regions D1, D2, D3, D4, D5, and D6, and the desired and/or predetermined data bit region 21 electrically connected to the second input portion 40 is the third data bit region D3 located on the reference layer 15.

If a writing signal is input through the second input portion 40, a magnetization direction of the third data bit region D3 may be determined according to this writing signal. For example, if the third data bit region D3 has a predetermined magnetization direction, the magnetization direction of the third data bit region D3 may be reversed or maintained based on an applied writing signal. A magnetization direction determined in this manner may represent a recorded data bit.

In the example shown in FIG. 7, the writing signal is a pulse-type switching current. A magnetization direction of a desired and/or predetermined data bit region 21, e.g., the third data bit region D3 of the memory track 11 located on the reference layer 15, may be selectively switched depending on polarity of this switching current, and a data bit to be stored, e.g., "0" or "1", may be stored on the desired and/or predetermined data bit region 21.

For example, assuming that the reference layer 15 has a predetermined magnetization direction and a data bit is determined as "0" if a magnetization direction of a predetermined data bit region 21 becomes the same as, e.g., parallel to, that of the reference layer 15 by application of a switching current; a data bit may be determined as a "1" if the desired and/or predetermined data bit region 21 has a magnetization direction opposite to that of the reference layer 15 by application of a switching current having an opposite polarity. Consequently, a data bit may be stored by changing the switching current's polarity to allow the magnetization direction of the desired and/or predetermined data bit region 21 to be the same as that of the reference layer 15, or to be opposite to that of the reference layer 15.

According to an example embodiment, the magnetization direction of the reference layer 19 may be determined in advance. Therefore, assuming that a data bit is "0" when the magnetization direction of the desired and/or predetermined data bit region 21 of the memory track 11 is parallel to that of the magnetization direction of the reference layer 15 and a data bit is "1" when the magnetization direction of the desired and/or predetermined data bit region 21 is anti-parallel to that of the magnetization direction of the reference layer 15, desired data may be stored using switching of the magnetization direction of the desired and/or predetermined data bit region 21 of the memory track 11.

When stored data is to be read in accordance with an example embodiment, a reading signal, e.g., a reading pulse current Pulse 2 (reading) illustrated in FIG. 7, may be input to the desired and/or predetermined data bit region 21 of the memory track 11 and the reference layer 15 through the second input portion 40. In example embodiments, the reference layer 15, the desired and/or predetermined data bit region 21 of the memory track 11 that is located on the reference layer 15, and the non magnetic layer 13 located therebetween may constitute a magnetic tunnel junction (MTJ) cell. Therefore, a passing value of a current and/or resistance changes depending on a magnetization direction of a desired and/or predetermined data bit region 21 of the memory track 11 relative to a magnetization direction of the reference layer 15. Data may be read based on the resistance change. In this example embodiment, a separate reference layer and input portion may be provided in order to read data.

Referring to FIG. 7, the reading pulse current Pulse 2 (reading) may be a pulse current smaller than the switching current for writing Pulse 2 (writing). This reading pulse current Pulse 2 (reading) is applied in synchronization with the domain motion signal Pulse 1. Therefore, stored data may be read using a magnetic domain motion and a magnetization direction of a desired and/or predetermined data bit region 21 located on the reference layer 15.

In an example embodiment of a magnetic memory device 10 having the above-described structure, inputting of a writing switching current and/or a reading switching current, and inputting of a motion signal may be sequentially performed. Therefore, a data writing operation or a stored data reading operation, and a magnetic domain motion may be performed in sequence so that a plurality of data bits may be sequentially recorded on a plurality of data bit regions or a plurality of data bits stored on the plurality of data bit regions may be sequentially read. A data writing operation and/or data reading operation in the memory track 10 is described below with reference to FIGS. 5A through 5C, and 6A and 6B.

Figure 5A:
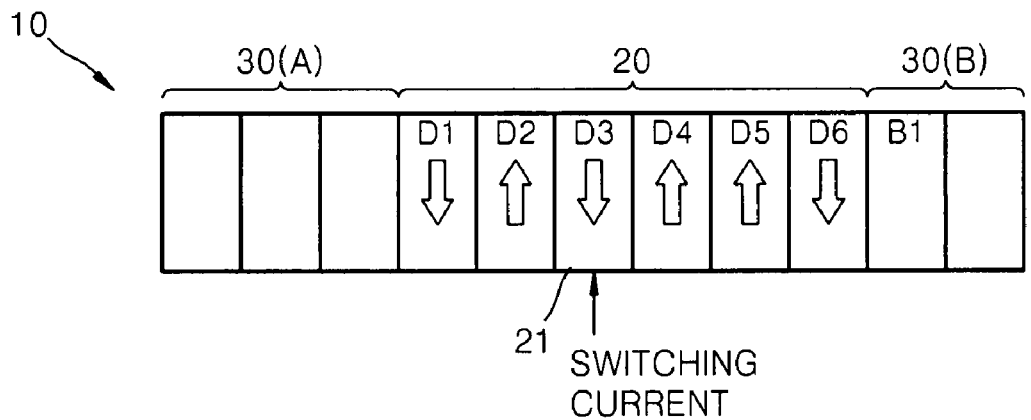
FIGS. 5A through 5C are views illustrating a switching current, which may be applied to a desired and/or predetermined data bit region (e.g., a third data bit region D3) of the example embodiment of the magnetic memory device of FIG. 4 so that a magnetization direction of the desired and/or predetermined data bit region is reversed, and the reversed magnetization direction of the desired and/or predetermined data bit region may be moved to an adjacent data bit region (e.g., fourth data bit region D4) because of a motion current.
Figure 5B:
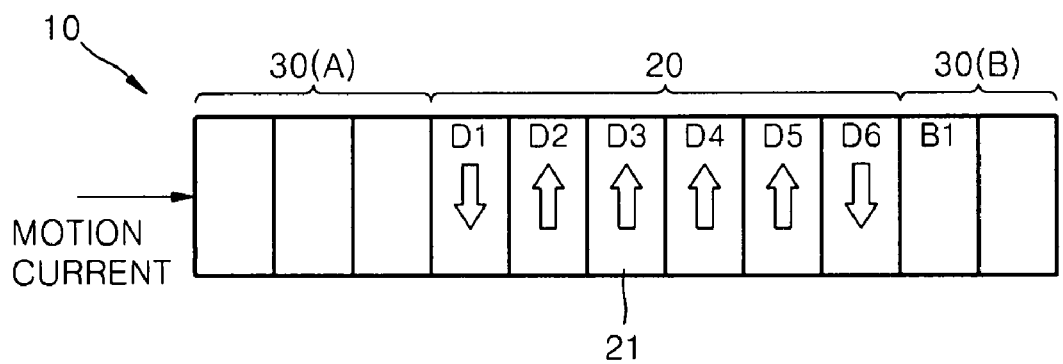
Figure 5C:
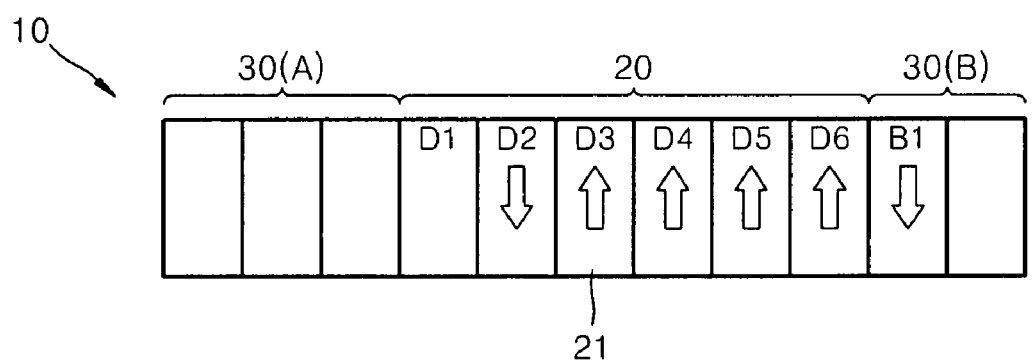
Figure 6A:
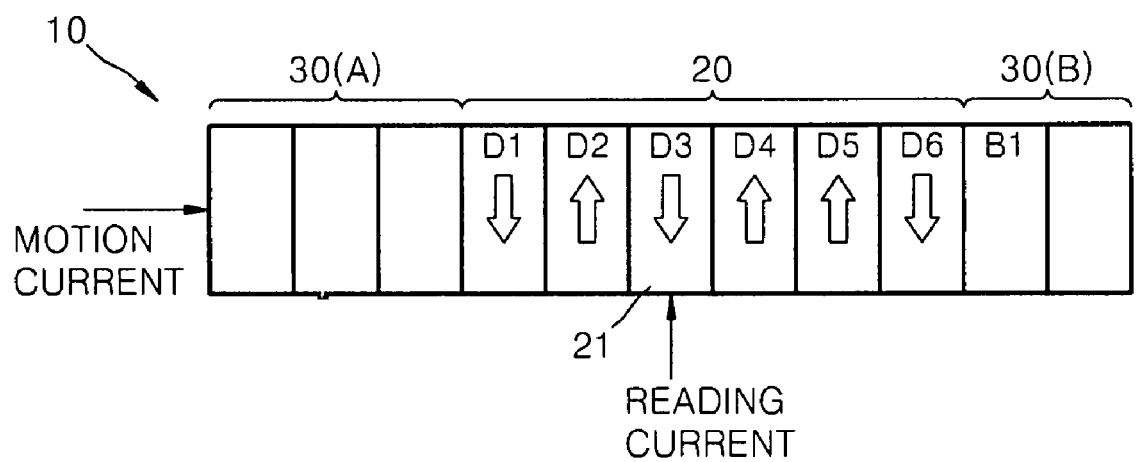
FIGS. 6A and 6B are views illustrating that a reading current may be applied to a desired and/or predetermined data bit region (e.g., a third data bit region D3) so that data of the desired and/or predetermined data bit region may be read, and the magnetization direction of the desired and/or predetermined data bit region may be moved to an adjacent region (e.g., a fourth data bit region D4) by a motion current.
Figure 6B:
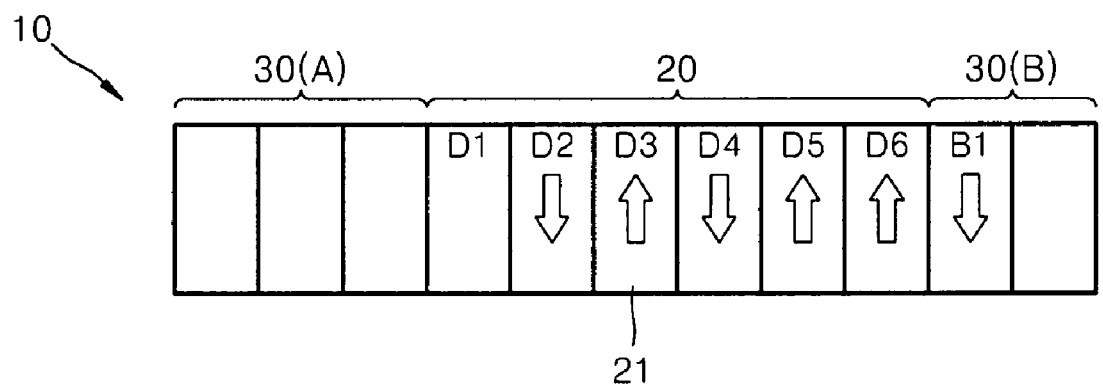

FIGS. 5A through 5C are views illustrating an example in which a switching current is applied to a third data bit region D3 of the magnetic memory device of FIG. 4 so that a magnetization direction of the third data bit region D3 is reversed, and the reversed magnetization direction of the third data bit region D3 is moved to an adjoining fourth adjoining data bit region D4 by a motion current. FIGS. 6A and 6B are views illustrating an example in which a reading current is applied to a third data bit region D3 of the magnetic memory device of FIG. 4 so that data of the third data bit region D3 is read, and the magnetization direction of the third data bit region D3 is moved to an adjoining fourth adjoining data bit region D4 by a motion current. FIG. 7 is a schematic graph illustrating an example magnetic domain motion current Pulse 1, an example reading current Pulse 2 (reading) and an example writing current Pulse 2 (writing) that may be applied to an example embodiment of a magnetic memory device 10. In FIG. 7, the horizontal axis is a time axis t.

The data writing operation may be performed in the following manner according to an example embodiment. When a switching current is applied to a third data bit region D3 as illustrated in FIG. 5A, a magnetization direction of the third data bit region D3 is reversed as illustrated in FIG. 5B. Thereafter, when a motion current is applied to the memory track 11, magnetization directions of the data bit regions are moved to adjoining data bit regions as illustrated in FIG. 5C. That is, magnetization directions of first to sixth data bit regions D1, D2, D3, D4, D5, and D6 of the data storage region 20 illustrated in FIG. 5B are moved by one-data bit region to the second to sixth data bit regions D2, D3, D4, D5, D6 and a first data bit region B1 of a second portion B of the buffer region 30 as illustrated in FIG. 5C.

As described above, the magnetization direction of the desired and/or predetermined data bit region 21 may be determined, and data represented as a magnetization direction of the desired and/or predetermined data bit region 21 may be moved to the adjoining data bit region (e.g., a fourth data bit region D4) after a time elapses. A writing signal may be input again to the desired and/or predetermined data bit region 21 to determine a magnetization direction again. Using a periodically applied motion current and a writing switching signal periodically applied in synchronization with the motion current illustrated in FIG. 7, such determining of a magnetization direction and the motion process may be performed in sequence so that a plurality of data bits may be recorded in an array on the plurality of data bit regions of the memory track 11. After a data recording operation is completed, a moved data storage position may be maintained or a motion signal moving the magnetic domains in the opposite direction may be input so that data stored on the first to sixth data bit regions D1, D2, D3, D4, D5, and D6 of the data storage region 20 may be maintained.

The stored data reading operation may be performed in the following manner according to an example embodiment. Referring to FIG. 6A, a reading current is applied to the third data bit region D3 so that data of the third data bit region D3 is read. Thereafter, when a motion current is applied to the memory track 11 as illustrated in FIG. 6B, magnetization directions of the data bit regions are moved to adjoining data bit regions. That is, magnetization directions of the first to sixth data bit regions D1, D2, D3, D4, D5, and D6 of the data storage region 20 illustrated in FIG. 6A are moved by one-data bit region to the second to sixth data bit regions D2, D3, D4, D5, D6 and the first data bit region B1 of the second portion B of the buffer region 30 as illustrated in FIG. 6B.

As described above, the magnetization direction of the desired and/or predetermined data bit region 21 may be read and data represented as magnetization direction of the predetermined data bit region 21 may be moved to the adjoining data bit region (e.g., the fourth data bit region D4) after a time elapses, and a reading signal may be input again to the desired and/or predetermined data bit region 21 to perform a data reading operation. Using a periodically applied motion current and a reading pulse signal (pulse current) periodically applied in synchronization with the motion current illustrated in FIG. 7, reading of a magnetization direction and the motion process may be performed in sequence until reading of a plurality of data bits stored on the memory track 11 is completed. After the data reading operation is completed, a moved data storage position may be maintained or a motion signal moving the magnetic domains in the opposite direction may be input so that data stored on the first to sixth data bit regions D1, D2, D3, D4, D5, and D6 of the data storage region 20 may be maintained.

During the reading operation, the reading pulse current may be periodically applied in synchronization with a domain motion signal without polarity reversion as illustrated in the example of FIG. 7. An amount of a current flowing through a tunnel barrier, and resistance thereof when the reading pulse current is applied to the reference layer 15 and the desired and/or predetermined data bit region 21 of the memory track 11, differ depending on whether a magnetization direction of the desired and/or predetermined data bit region 21 of the memory track 11 is parallel to or anti-parallel to a magnetization direction of the reference layer 15. For example, resistance when the magnetization direction of the desired and/or predetermined data bit region 21 of the memory track 11 is parallel to that of the reference layer 15 is smaller than resistance when the magnetization direction of the predetermined data bit region 21 is anti-parallel to the reference layer 15.

Data stored in the desired and/or predetermined data bit region 21 may be recognized using such a resistance difference.

In the above described example embodiment, a magnetic domain motion is performed by one data bit region unit and the magnetic domain motion and the data bit writing or reading operation are performed sequentially. However, the above described example embodiments are not intended to be limiting and thus, various modifications are possible. For example, after a plurality of data bit regions is moved, the writing or reading operation may be performed.

Figure 8:
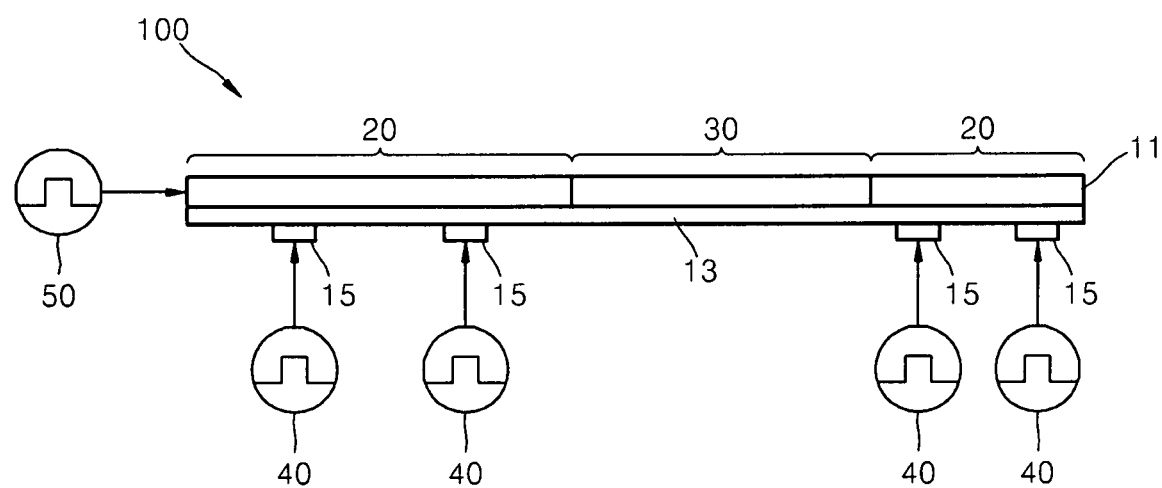
FIG. 8 is a schematic view of another example embodiment of a magnetic memory device.

FIG. 8 is a schematic view of a magnetic memory device 100 according to another embodiment. Referring to FIG. 8, the magnetic memory device 100 may have a structure in which a plurality of data storage regions 20 is provided on the memory track 11. Further, the memory track 11 may further include a buffer region 30 adjoining the data storage region 20 and for storing data moved to outside of the data storage region 20 due to a magnetic domain motion. At least one second input portion 40 may be formed for each data storage region 20. According to an example embodiment, if a plurality of data storage regions 20 are provided and at least one second input portion 40 corresponding to each of the data storage regions 20 is formed, a data storage capacity may be increased. According to this example embodiment, the data storage capacity may increase as the number of the data storage regions 20 increases, and a data storing and/or reading speed may be the same or faster than the data storing and/or reading speed of the previously described example embodiments of the magnetic memory device 10 that include the memory track 11 having a single data storage region including a plurality of data bit regions.

FIG. 8 shows an example embodiment of a magnetic memory device 100 in which a buffer region 30 is formed between two data storage regions 20. In a structure where a plurality of data storage regions 20 are formed, buffer regions 30 may be formed at one or more of a position located before a first data storage region, a position located after a last data storage region, and a position located between two adjacent data storage regions.

The example shown in FIG. 8 illustrates that two reference layers 15 and two second input portions 40 may be formed for one data storage region 20. If a plurality of second input portions 40 are formed for one data storage region 20, a data storing and/or reading speed may be enhanced relative to conventional devices and the previously-described example embodiments.

An example embodiment of the magnetic memory device 100 may have a structure in which a plurality of reference layers 15 and second input portions 40 may be formed for one data storage region 20 and inputting of a writing signal and/or a reading signal may be performed through different second input portions 40. Also, the inputting of a writing signal may be performed for a desired and/or predetermined data storage region 20, and the inputting of a reading signal may be performed for another desired and/or predetermined data storage region 20.

Also, in the above descriptions, a magnetic memory device according to an example embodiment may incorporate a magnetic device capable of reading a plurality of data bits (e.g., an MTJ or GMR sensor) and a recording magnetic device using spin transfer torque into a single device. However, example embodiments are not limited to this configuration. For example, a magnetic memory device according to an example embodiment may be used as a magnetic device (e.g., an MTJ or GMR sensor) capable of reading a plurality of data bits using a magnetic domain motion, or may be also used as a recording magnetic device using spin transfer torque, capable of recording a plurality of data bits using the magnetic domain motion.

Also, in the above descriptions, a magnetic memory device according an example embodiment is described that performs a data writing operation using the spin transfer torque by directly applying a writing current signal to an MTJ cell including the reference layer 15, the desired and/or predetermined data bit region 21 of the memory track 11 that is located on the reference layer 15 and the non-magnetic layer 13 interposed therebetween. However, it should be understood that example embodiments are also not limited to this configuration or operation.

That is, according to an example embodiment of a magnetic memory device, a data bit may be recorded by selectively reversing a magnetization direction of a magnetic domain of a desired and/or predetermined data bit region of the memory track 11 using a magnetic field induced by a current. In this case, an example embodiment of a magnetic memory device may include a structure generating a magnetic field for selectively reversing a magnetization direction of the desired and/or predetermined data bit region of the memory track 11, and a FET for reading data stored in the memory track 11, instead of the second input portion 40 directly applying a writing or reading current signal to the memory track 11.

An example embodiment of a magnetic memory device may include a memory track formed of an amorphous soft magnetic material having a high magnetic anisotropy constant and where a plurality of magnetic domains are formed, so that a magnetic domain motion may be easily performed even with a relatively low current.

Also, because a data bit, which may be a magnetic domain, may be stored in an array on the memory track, a plurality of data bits may be stored per cell to which an example embodiment of the magnetic memory device is applied, which may remarkably increase a data storage capacity.

While example embodiments have been particularly shown and described with reference to drawings, it will be understood by those of ordinary skill in the art that various changes in form and details may be made therein without departing from the spirit and scope defined by the following claims.

What is claimed is:

1. A magnetic memory device comprising:
   a memory track including a plurality of magnetic domains and storing a plurality of data bits in an array, each magnetic domain corresponding to a data bit;
   a reference layer corresponding to a portion of the memory track and having a pinned magnetization direction; and
   a first input portion electrically connected to the memory track and inputting a magnetic domain motion signal to move data stored on a data bit region of the memory track to an adjacent data bit region; and
   at least one second input portion electrically connected to at least one data bit region of the memory track and to the reference layer, and inputting at least one of a writing current signal and a reading current signal; wherein
   the memory track is formed of an amorphous soft magnetic material,
   a magnetization direction of the memory track is switchable.

2. The memory device of claim 1, wherein the memory track is formed of NiFe group IV element alloy.

3. The memory device of claim 2, wherein the memory track is formed of NiFeSiB.

4. The memory device of claim 1, wherein the amorphous soft magnetic material has a magnetic anisotropy constant larger than a magnetic anisotropy constant of NiFe.

5. The memory device of claim 1, wherein a size of each data bit region is based on the reference layer.

6. The memory device of claim 5, wherein the size of each data bit region is equal to an effective size of the reference layer.

7. The memory device of claim 1, wherein a non-magnetic layer is interposed between the reference layer and the memory track.

8. The memory device of claim 7, wherein the non-magnetic layer is one of a conduction layer and an insulation layer serving as a tunneling barrier.

9. The memory device of claim 1, wherein the memory track comprises:
   at least one data storage region having data bit regions corresponding to a number of data bits to be stored and storing a plurality of data bits; and
   at least one buffer region adjacent to a data storage region of the at least one data storage region and storing data moved outside of the data storage region during a magnetic domain motion.

10. The memory device of claim 9, wherein the memory track has a plurality of data storage regions, a buffer region located between two adjacent data storage regions, and at least one of the at least one second input portion is formed for each data storage region.

11. A method of reading data from the memory device of claim 1, the method comprising:
    applying the reading current signal to a data bit region of a data storage region of the memory track, the memory track being formed of the amorphous soft magnetic material;
    obtaining a resistance value of the data bit region, the resistance value of the data bit region varying based on magnetization; and
    determining data stored in the data bit region based on the obtained resistance value.

12. The method of claim 11, further comprising:
    repeating applying the reading current signal, obtaining the resistance value, and determining data stored for each data bit region of the memory device.

13. A method of writing data to a memory device, the method comprising:
    switching a magnetization direction of a data bit region of at least one data storage region of a memory track to affect a magnetic domain of the data bit region, the magnetization direction of the data bit region being switched by applying a writing current signal to the data bit region, the memory track being formed of an amorphous soft magnetic material; and
    moving the affected magnetic domain to an adjacent data bit region of the memory device after the switching of the magnetization direction.

14. The device of claim 1, wherein data is written to the memory track using current induced magnetic switching.

15. The method of claim 13, wherein the data is written using current induced magnetic switching.

16. The method of claim 13, wherein the affected magnetic domain is moved to an adjacent data bit region of the memory device by applying a magnetic domain motion signal via a first input portion electrically connected to the memory track, and wherein the writing current signal is applied via at least one second input portion electrically connected to the memory track.

* * * * *